(12) United States Patent
Matsutera et al.

(10) Patent No.: US 7,126,201 B2
(45) Date of Patent: Oct. 24, 2006

(54) MAGNETIC RANDOM ACCESS MEMORY

(75) Inventors: Hisao Matsutera, Tokyo (JP); Hideaki Numata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/520,652

(22) PCT Filed: Jul. 3, 2003

(86) PCT No.: PCT/JP03/08460

§ 371 (c)(1),
(2), (4) Date: Jan. 7, 2005

(87) PCT Pub. No.: WO2004/006335

PCT Pub. Date: Jan. 15, 2004

(65) Prior Publication Data

US 2005/0242407 A1    Nov. 3, 2005

(30) Foreign Application Priority Data

Jul. 9, 2002    (JP)    .............................. 2002/200562

(51) Int. Cl.
*H01L 29/82* (2006.01)
*G11C 11/15* (2006.01)
(52) U.S. Cl. ...................... 257/421; 365/173
(58) Field of Classification Search .............. 257/421; 365/173
See application file for complete search history.

(56) References Cited

U.S. PATENT DOCUMENTS 6,205,052 B1 *  3/2001  Slaughter et al. ........... 365/173
6,233,172 B1 *  5/2001  Chen et al. ................. 365/173
6,292,389 B1    9/2001  Chen et al.
6,418,048 B1 *  7/2002  Sin et al. ................... 365/173

FOREIGN PATENT DOCUMENTS

| JP | 10-188235 | 7/1998 |
|---|---|---|
| JP | 2000-332318 | 11/2000 |
| JP | 2001-119082 | 4/2001 |
| JP | 2003-078185 | 3/2003 |

OTHER PUBLICATIONS

Kools, J.C.S. et al., "Effect of Finite Magnetic Film Thickness on Néel Coupling in Spin Valves" *Journal of Applied Physics*, vol. 85, No. 8, Apr. 15, 1999.

* cited by examiner

*Primary Examiner*—Andy Huynh
*Assistant Examiner*—Earl N. Taylor
(74) *Attorney, Agent, or Firm*—Michael Best & Friedrich LLP

(57) ABSTRACT

A technique is provided in which an offset magnetic field of a memory cell of a MRAM is reduced more effectively. The MRAM of the present invention is composed of a free layer (11) which has a reversible free spontaneous magnetization, a fixed layer (6) which has fixed spontaneous magnetization, and a spacer layer (10) formed of non-magnetic interposed between the free layer (11) and the fixed layer (6). The fixed layer (6) is formed such that orange peel effect and magnetostatic coupling effect does not substantially influence on the free layer (11).

6 Claims, 13 Drawing Sheets

$H_{off}$ : OFFSET MAGNETIC FIELD

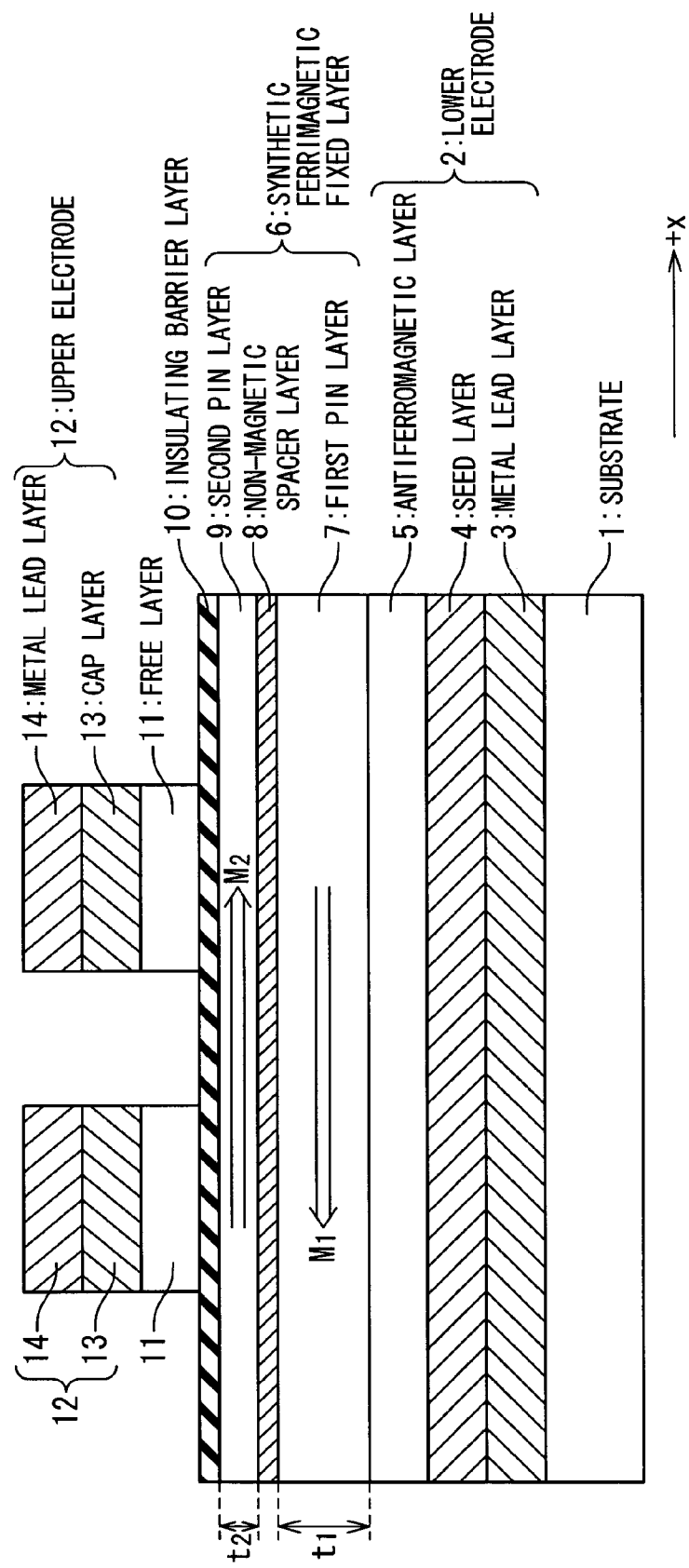

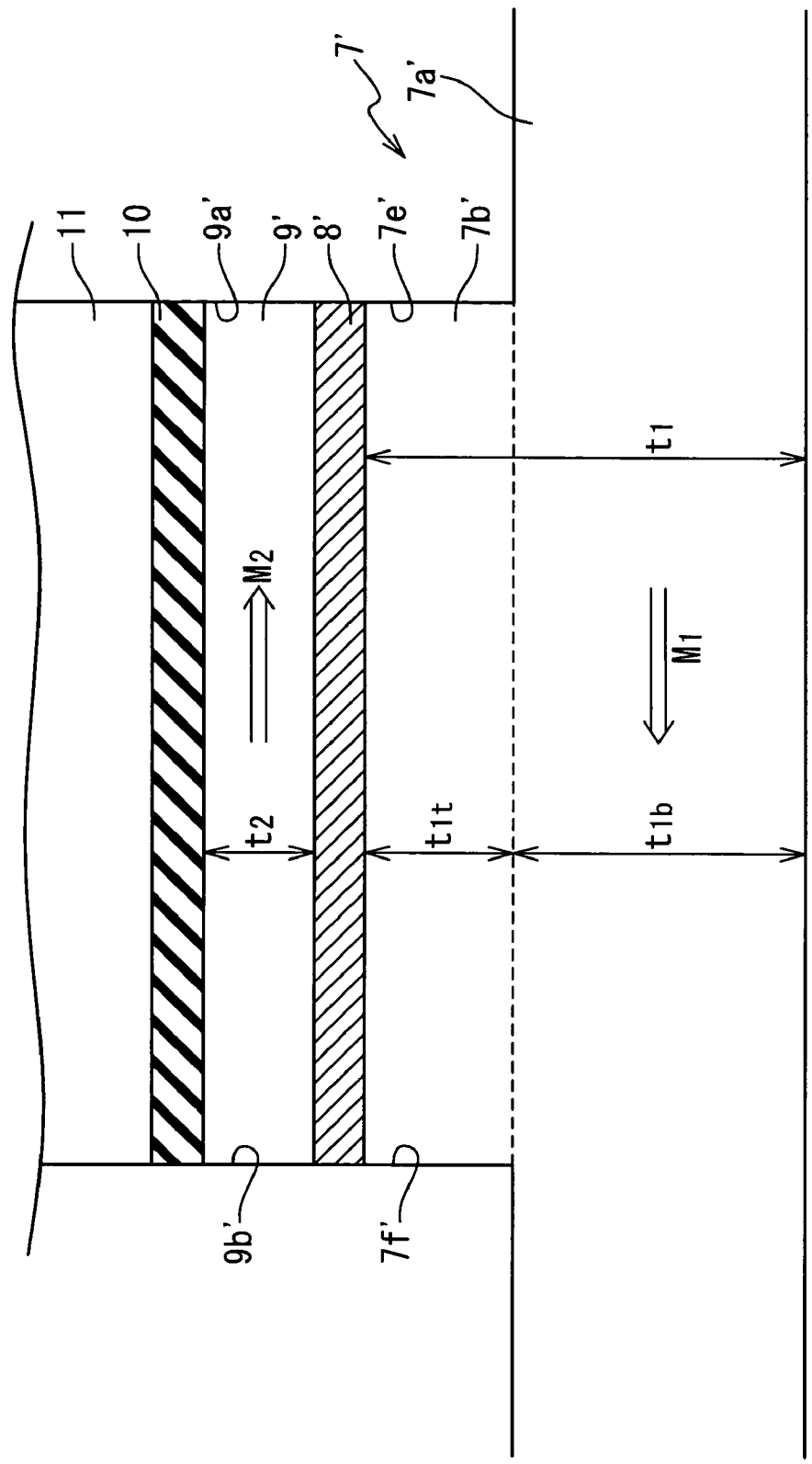

MAGNETIC RANDOM ACCESS MEMORY

This application claims the benefit of International Patent Application No. PCT/JP03/08460 filed Jul. 3, 2003, which claims priority of Japanese Patent Application No. 200562/2002, filed Jul. 9, 2002.

TECHNICAL FIELD

The present invention relates to a magnetic random access memory (MRAM). The present invention is more particularly directed to a technique for canceling an offset magnetic field which is produced in a memory cell of an MRAM.

BACKGROUND ART

A specific attention has been paid to a magnetic random access memory (to be referred to as "MRAM" hereinafter) as a non-volatile memory capable of a writing operation in a high speed, and also having a large number of times of rewrite.

As shown in FIG. 1, a memory cell of a typical MRAM contains a magnetic resistance element 104 composed of a pinned layer 101 having a fixed spontaneous magnetization, a free layer 102 having a spontaneous magnetization which can be reversed, and a non-magnetic material spacer layer 102 which is interposed between the pinned layer 101 and the free layer 102. The free layer 102 is formed in such a manner that the direction of the spontaneous magnetization of the free layer 102 can be set in parallel to or in anti-parallel to that of the spontaneous magnetization of the pinned layer 101.

The memory cell stores 1-bit data as the direction of the spontaneous magnetization of the free layer 102. The memory cell can take two states, namely a "parallel" state and an "anti-parallel" state. In the "parallel" state, the direction of the spontaneous magnetization of the free layer 102 and that of the spontaneous magnetization of the pinned layer 101 are parallel to each other. In the "anti-parallel" state, the direction of the spontaneous magnetization of the free layer 102 and that of the spontaneous magnetization of the pinned layer 101 are anti-parallel to each other. The memory cell stores the 1-bit data by setting any one of the "parallel" state and the "anti-parallel" state to "0", and by setting the other to "1."

A reading operation of data from the memory cell is carried out by sensing a change in resistances of the memory cell due to a magneto-resistance effect. The directions of the spontaneous magnetizations of the pinned layer 101 and the free layer 102 give an influence to resistances of the memory cell. When both the direction of the spontaneous magnetization of the pinned layer 101 and the direction of the spontaneous magnetization of the free layer 102 are parallel to each other, the resistance of the memory cell is a first value "R". When both the direction of the spontaneous magnetization of the pinned layer 101 and the direction of the spontaneous magnetization of the free layer 102 are anti-parallel to each other, the resistance of the memory cell is a second value "R+ΔR". Thus, the directions of the spontaneous magnetizations of the pinned layer 101 and of the free layer 102, namely, the data which has been stored in the memory cell can be discriminated by sensing the resistances of the memory cell.

A writing operation of data into the memory cell is carried out by supplying currents to signal lines (typically, a word line and a bit line) which are arranged in a memory cell array, and by reversing the direction of the spontaneous magnetization of the free layer 102 through application of a magnetic field which is produced by the currents.

A ferromagnetic layer of the free layer 102 has a magnetic field-magnetization characteristic (H-M characteristic) symmetrical with respect to the applied magnetic field essentially (namely, as nature of a bulk of the ferromagnetic). Therefore, a resistance value of the memory cell ideally represents a symmetrical characteristic with respect to a write magnetic field which is applied to the memory cell for data write, as shown in FIG. 2A.

However, as shown in FIG. 2B, an actual resistance value of the memory cell represents an asymmetrical characteristic with respect to the write magnetic field. That is to say, the characteristic has an offset magnetic field "$H_{off}$". Presence of the offset magnetic field "$H_{off}$" implies that the write magnetic fields used to write data of "1" and "0" are different from each other. The offset magnetic field "$H_{off}$" is not preferable since a memory operation margin is reduced, and a current required for writing data is increased.

As a cause of this offset magnetic field, the Orange Peel Coupling effect (or Neel's coupling effect) is known. J. C. S. Kools et al. report the generation of the offset magnetic field due to the Orange Peel Coupling effect in "Effect of finite magnetic film thickness on Neel's Coupling in spin valves" (Journal of Applied Physics, Vol. 85, p. 4466 (1999)).

As shown in FIG. 3, the orange peel coupling effect is caused by a non-flatness of the surfaces of the pinned layer 101 and the free layer 102. In the manufacturing steps of the memory cell of the MRAM, it is practically difficult to make the surfaces of the pinned layer 101 and the free layers 102 completely flat. In an actual case, the surfaces of the pinned layer 101 and the free layer 102 are waved. Waving of both the pinned layer 101 and the free layer 102 produces an interlayer coupling field between the spontaneous magnetizations of the pinned layer 101 and the free layer 102. This interlayer coupling field causes the offset magnetic field in the memory cell.

As another cause of the generation of the offset magnetic field, the Magneto-Static Coupling effect is known. This magneto-static coupling effect is also called as a "fringe effect". As shown in FIG. 4, the magneto static coupling effect is caused since magnetic poles are generated at ends of the pinned layer 101. A magnetic field "$H_{MS}$" which is generated by the magnetic poles is applied to the free layer 102. As a consequence, an asymmetrical characteristic is led in a reversion magnetic field by which the direction of spontaneous magnetization of the free layer 102 is reversed. This asymmetrical characteristic of the reversion magnetic field becomes the cause that the memory cell has the offset magnetic field.

U.S. Pat. No. 6,233,172 discloses the technique for eliminating the offset magnetic field in the memory cell by utilizing that the direction of the magnetic field generated based on the orange peel coupling effect and the direction of the magnetic field generated based on the magneto-static coupling effect are opposite to each other so that the orange peel coupling effect and the magneto-static coupling effect are cancelled.

FIG. 5 indicates the structure of the memory cell of the MRAM disclosed in the above-described U.S. patent. This structure is composed of a substrate 112, a lower electrode stacked layer film 114, a spacer layer 116, and an upper electrode stacked layer film 118. The lower electrode stacked layer film 114 is composed of a bottom layer 120, an anti-ferromagnetic layer 122, a pinned ferromagnetic layer 124, a ruthenium layer 126 and a fixed ferromagnetic layer 128. The upper electrode stacked layer film 118 is composed of a free ferromagnetic layer 130 and a protection layer 132. Both the pinned ferromagnetic layer 124 and the fixed ferromagnetic layer 128 have the spontaneous magnetizations whose directions are fixed, whereas the free ferromagnetic layer 130 has the spontaneous magnetization whose direction can be reversed.

The above-described US patent discloses that cancellation of the orange peel coupling effect and the magneto-static coupling effect can be achieved by satisfying the following equation:

$$M_1T_1 < M_2T_2.$$

In this equation, a symbol "$T_1$" indicates a film thickness of the pinned ferromagnetic layer 124, and a symbol "$M_1$" indicates a magnetization of the pinned ferromagnetic layer 124. Also, a symbol "$T_2$" indicates a film thickness of the fixed ferromagnetic layer 128, and a symbol "$M_2$" indicates a magnetization of the fixed ferromagnetic layer 128. The above-described equation can be satisfied under the following conditions:

$$T_1 < T_2 \text{ and } M_1 = M_2,$$

$$T_1 = T_2 \text{ and } M_1 < M_2,$$

$$\text{or } T_1 < T_2 \text{ and } M_1 < M_2.$$

However, as shown in FIG. 6A and FIG. 6B, the magneto-static coupling effect is not uniform within the free layer 102. FIG. 6B shows a calculation result of the magnetic field applied to the free layer 102 due to the magneto-static coupling effect in a rectangular memory cell having the shape shown in FIG. 6A. The magnetic field received by the free layer 102 is large near the ends of the pinned layer 101, and is small on a position separated far from the ends of the pinned layer 101. As described above, the magnetic field received by the free layer 102 is not uniform, and it is difficult that the orange peel coupling effect is canceled by the magneto-static coupling effect over the entire inner portion of the memory cell.

Furthermore, recent progress in very fine technique for the MRAM may makes it difficult to cancel the orange peel coupling effect by the magneto-static coupling effect in each of large numbers of memory cells contained in the MRAM. The free layer is made thinner in accompaniment with the finer memory cell in the MRAM, so that the orange peel coupling effect influences strongly. In addition, dimensions of pinned layers are decreased, so that the magneto-static coupling effect influences strongly. The deviations of the magnitude of the orange peel coupling effect and that of the magneto-static coupling effect dependent on the manufacturing process increases. As a consequence, the deviations of these effects in every memory cell increase. The increase of these deviations may makes it difficult to cancel the orange peel coupling effect and the magneto-static coupling effect in each of the memory cells, and disturbs that the offset magnetic field is eliminated in each of these memory cells contained in the memory cell arrays of the MRAM.

Japanese Laid-Open Patent Applications (JP-P2000-332318 and JP-A-Heisei 10-188235) disclose a structure of a magneto-resistance element used to provide a highly reliable magnetic head having a high sensitivity by controlling an external magnetic field applied to a free layer. However, these conventional examples do not describe that an offset magnetic field of the free layer of the magneto-resistance element is eliminated. The magnetic head requires that the free layer is located at a proper bias point, but do not require that the offset magnetic field of the free layer is eliminated.

Under such a circumstance, a technique for effectively reducing an offset magnetic field in a memory cell is demanded. In particular, the techniques are demanded in which the offset magnetic field can be uniformly reduced over the whole of internal portion in the memory cell, and the offset magnetic field can be eliminated in each of the memory cell without being adversely influenced by a manufacturing deviation.

DISCLOSURE OF INVENTION

An object of the present invention is to provide a technique for more effectively reducing an offset magnetic field in a memory cell of an MRAM.

Another object of the present invention is to provide a technique for uniformly reducing an offset magnetic field over the whole of inside of the memory cell of an MRAM.

Another object of the present invention is to provide a technique for suppressing an adverse influence to elimination of an offset magnetic field in a memory cell of an MRAM through a manufacturing deviation.

In an aspect of the present invention, a magnetic random access memory include a free layer which has reversible free spontaneous magnetization, a fixed layer which has fixed spontaneous magnetization, and a spacer layer formed of non-magnetic material interposed between the free layer and the fixed layer. The fixed layer does not substantially exert orange peel effect and magneto-static coupling effect on the free layer. In the MRAM, since the orange peel effect and the magneto-static coupling effect does not influence on the free layer, there is no problem of a deviation between the orange peel effect and the magneto-static coupling effect and ununiformity of the magneto-static coupling effect in the memory cell.

The fixed layer may include a first pinned layer which has another fixed spontaneous magnetization in which a direction of a magnetization is fixed into a second direction opposite to a first direction as a direction of the fixed spontaneous magnetization, and a second pinned layer which is provided between the first pinned layer and the free layer and has the fixed spontaneous magnetization. In this case, it is preferable that the first pinned layer and the second pinned layer are formed such that the fixed layer does not substantially give the influence of the orange peel effect and the magneto-static coupling effect to the free layer.

The suppression of the influence of the orange peel effect and the magneto-static coupling effect to the free layer by the fixed layer is effectively accomplished by determining a summation of a first magnetic field applied to the free layer by the first pinned layer due to the orange peel effect and a second magnetic field applied to the free layer by the second pinned layer due to the orange peel effect to be substantially zero.

Also, when the fixed layer contains the spacer layer of non-magnetic material interposed between the first pinned layer and the second pinned layer, it is preferable that the other spacer layer has a film thickness such that the fixed spontaneous magnetization and the another fixed spontaneous magnetization are anti-ferromagnetically coupled. The other spacer layer stabilizes the directions of the fixed spontaneous magnetization and the other fixed spontaneous magnetization, and therefore stabilizes an operation of the MRAM.

Also, when the fixed layer is provided to extend in the first direction, it is preferable that a distance between ends of the fixed layer and the free layer is large to an extent that a magnetic field generated by magnetic poles produced in the ends does not interlink with a magnetic field of the free layer. Since the magneto-static coupling effect is based on the magnetic poles produced at the ends of the fixed layer, the magneto-static coupling effect to the free layer by the fixed layer is effective suppressed by separating the ends sufficiently largely from the free layer.

In another aspect of the present invention, a magnetic random access memory includes a free layer which has reversible free spontaneous magnetization, a synthetic ferrimagnetic fixed layer, and a spacer layer formed of non-magnetic material and interposed between the free layer and the synthetic ferrimagnetic fixed layer. The synthetic ferrimagnetic fixed layer includes a first pinned layer which has a first fixed spontaneous magnetization in a first direction, a second pinned layer which has a second fixed spontaneous magnetization in a second direction which is opposite to the first direction. The first pinned layer includes a first portion provided to extend the first direction, and a second portion formed on the first portion such that the second portion is aligned in position with the second pinned layer in a direction perpendicular to a surface of the substrate on which the magnetic random access memory is formed. The first pinned layer and the second pinned layer are formed such that the synthetic ferrimagnetic fixed layer does not substantially exert the orange peel effect on the free layer. When the first fixed spontaneous magnetization is $M_1$, the second fixed spontaneous magnetization is $M_2$, and the second portion has a thickness of $t_2$, the second portion is formed to have a thickness of $(M_2/M_1)*t$. The second portion with such a thickness cancels a magnetic field generated by the magnetic poles produced in the ends of the second pinned layer, and the fixed layer suppresses the magneto-static coupling effect to the free layer Also, in another aspect of the present invention, a magnetic random access memory includes a free layer which has reversible free spontaneous magnetization, a synthetic ferrimagnetic fixed layer, and a spacer layer of non-magnetic material interposed between the free layer and the synthetic ferrimagnetic fixed layer. The synthetic ferrimagnetic fixed layer includes a first pinned layer which has first fixed spontaneous magnetization in a first direction, and a second pinned layer provided between the free layer and the first pinned layer to have second fixed spontaneous magnetization on a second direction which is opposite to the first direction. The first pinned layer and the second pinned layer are formed such that a summation of a first magnetic field applied to the free layer by the first pinned layer due to orange peel effect and orange peel effect and a second magnetic field applied to the free layer by the second pinned layer is substantially zero. In the MRAM, the orange peel effect to the free layer by the second pinned layer is canceled with the orange peel effect to the free layer by the orange peel effect. The synthetic ferrimagnetic fixed layer does not substantially give the orange peel effect to the free layer. Through the suppression of the orange peel effect, the MRAM can effectively suppress the offset magnetic field of the memory cell.

When the synthetic ferrimagnetic fixed layer contains another spacer layer of non-magnetic material and provided between the first pinned layer and the second pinned layer, it is preferable that the other spacer layer has a film thickness such that the first fixed spontaneous magnetization and the second fixed spontaneous magnetization are anti-ferromagnetically coupled.

In another aspect of the present invention, a magnetic random access memory includes a free layer which has reversible free spontaneous magnetization, a fixed layer which has fixed spontaneous magnetization in a first direction, and a spacer layer formed of non-magnetic material interposed between the free layer and the fixed layer. The fixed layer is provided to extend in the first direction, and a distance between ends of the fixed layer and the free layer is long to an extent that a magnetic field generated by magnetic poles in the ends does not interlink with a magnetic filed of the free layer. Since the magneto-static coupling effect depends upon the magnetic poles produced in the ends of the fixed layer, the magneto-static coupling effect can be effectively suppressed by sufficiently separating the ends of the fixed layer and the free layer.

In another aspect of the present invention, a magnetic random access memory includes a free layer which has reversible free spontaneous magnetization, a synthetic ferrimagnetic fixed layer, and a spacer layer of non-magnetic material interposed between the free layer and the synthetic ferrimagnetic fixed layer. The rein the synthetic ferrimagnetic fixed layer includes a first pinned layer which has first fixed spontaneous magnetization in the first direction, and a second pinned layer provided between the free layer and the first pinned layer to have second fixed spontaneous magnetization in the second direction which is opposite to the first direction. The first pinned layer includes a first portion provided to extend in the first direction and the second direction, and a second portion formed on the first portion such that the second portion is aligned in position with the second pinned layer in a direction perpendicular to a surface of a substrate on which the magnetic random access memory is formed. When the first fixed spontaneous magnetization is $M_1$, the second fixed spontaneous magnetization is $M_2$ and a thickness of the second pinned layer is $t_2$, the second portion is formed to have a thickness substantially equal to $(M_2/M_1)*t_2$. The second portion with the thickness of $(M_2/M_1)*t_2$ generates due to the magneto-static coupling effect, a magnetic field with the same intensity as the magnetic field applied to the free layer by the second pinned due to the magneto-static coupling effect and the direction opposite to the magnetic field applied.

In another aspect of the present invention, a magnetic random access memory includes a free layer which has reversible free spontaneous magnetization, a synthetic ferrimagnetic fixed layer, and a spacer layer of non-magnetic material interposed between the free layer and the synthetic ferrimagnetic fixed layer. The synthetic ferrimagnetic fixed layer includes a first pinned layer which has first fixed spontaneous magnetization in a first direction, and a second pinned layer provided between the spacer layer and the first pinned layer to have second fixed spontaneous magnetization in a second direction which is opposite to the first direction. The first fixed spontaneous magnetization, the second fixed spontaneous magnetization, a film thickness of the first pinned layer and a film thickness of the second pinned layer are determined such that a magnetic field applied to the free layer by the synthetic ferrimagnetic fixed layer due to orange peel effect and a magnetic field applied to the free layer by the synthetic ferrimagnetic fixed layer due to magneto-static coupling effect are 10 (Oe) or below. The MRAM is designed such that the free layer is affected by the orange peel effect and the magneto-static coupling effect by optimizing the first and second pinned layers. Therefore, the MRAM does not have problems of a deviation of the orange peel effect and ununiformity of the magneto-static coupling effect in the memory cell.

Also, in another aspect of the present invention, a magnetic random access memory includes a free layer which has reversible free spontaneous magnetization, a synthetic ferrimagnetic fixed layer, and a spacer layer of non-magnetic material interposed between the free layer and the synthetic ferrimagnetic fixed layer. The synthetic ferrimagnetic fixed layer includes a first pinned layer which has first fixed spontaneous magnetization in a first direction, and a second pinned layer provided between the spacer layer and the first pinned layer to have second fixed spontaneous magnetization in a second direction which is opposite to the first direction. The first fixed spontaneous magnetization $M_1$, the second fixed spontaneous magnetization $M_2$, a film thickness of the first pinned layer $t_1$ and a film thickness of the second pinned layer $t_2$ are determined to satisfy the following equation:

$$\frac{M_1}{M_2} \cdot \frac{t_1}{t_2} > 1$$

The orange peel effect can be effectively suppressed by determining the first fixed spontaneous magnetization $M_1$, the second fixed spontaneous magnetization $M_2$, a film thickness of the first pinned layer $t_1$ and a film thickness of the second pinned layer $t_2$.

Also, in order to simplify the manufacturing process of the MRAM, it is preferable that the first pinned layer and the second pinned layer are formed of same material and the $M_1$ and the $M_2$ are substantively equal to each other.

Also, it is preferable that that satisfaction of the following equation:

$$M_1 > M_2$$

allows the orange peel effect to be substantially 0.

The above structure is especially preferable when the spacer layer is formed of nonmagnetic and insulating material, this structure is especially suitable and the thickness of the spacer layer is thin to an extent that a tunnel current flows in a thickness direction, namely, when the MTJ is used for the memory cell. In the above structure, the offset magnetic field of the memory cell in which the influence of the orange peel coupling effect is large since the MTJ is used for the MRAM can be effectively suppressed although the film thickness of the spacer layer is thin so that the influence of the orange peel coupling effect is large when the MTJ is used for the memory cell.

As previously described, the present invention can more effectively reduce the offset magnetic field of the memory cell of the MRAM.

Also, the present invention can uniformly reduce the offset magnetic fields over the entire internal area of the memory cells of the MRAM.

Also, the present invention can suppress the offset magnetic fields as the adverse influence caused due to the manufacturing deviation of the MRAM.

BRIEF DESCRIPTION OF THE DRAWINGS

FIG. 7 is a cross sectional view showing an MRAM according to a first embodiment of the present invention;

FIG. 13 is an enlarged cross sectional view showing a part of the MRAM according to the second embodiment of the present invention.

BEST MODE FOR CARRYING OUT INVENTION

Figure 1:
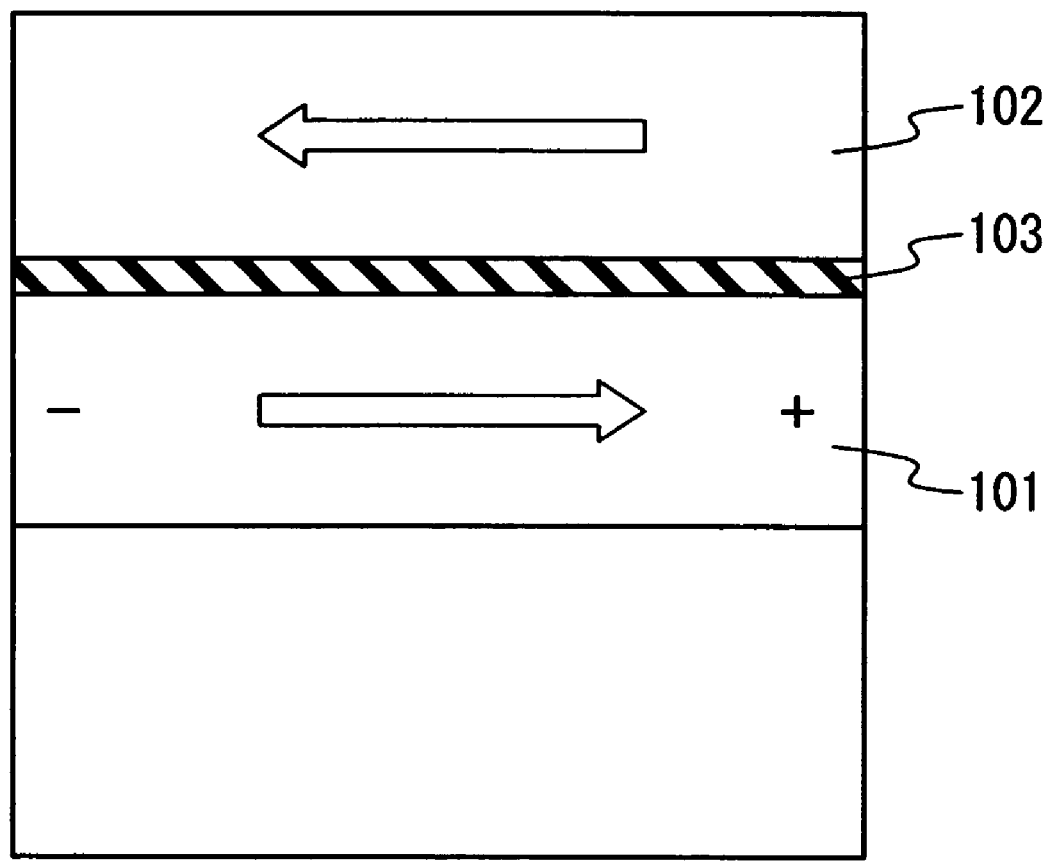
FIG. 1 is a cross sectional view showing a conventional MRAM.
Figure 2A:
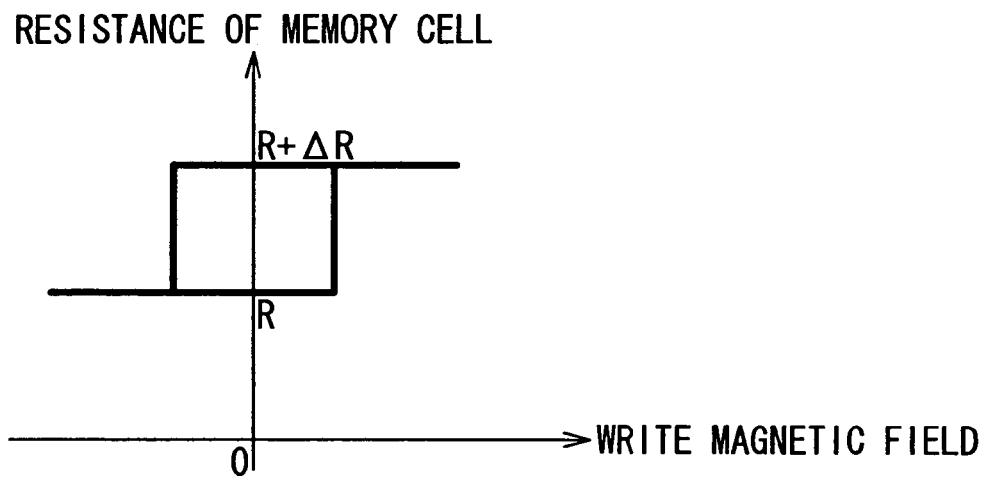
FIG. 2A is a diagram showing a resistance characteristic in an ideal memory cell.
Figure 2B:
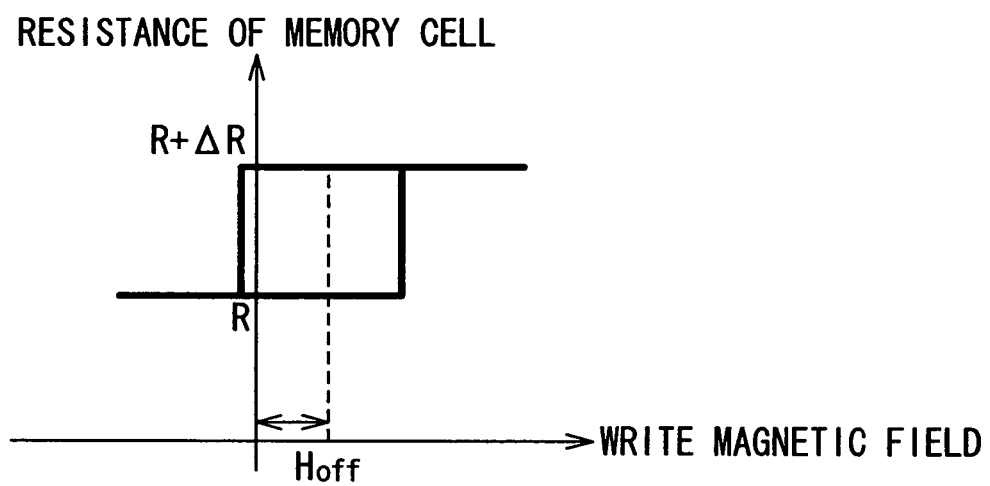
FIG. 2B is a diagram showing a resistance characteristic in an actual memory cell.
Figure 3:
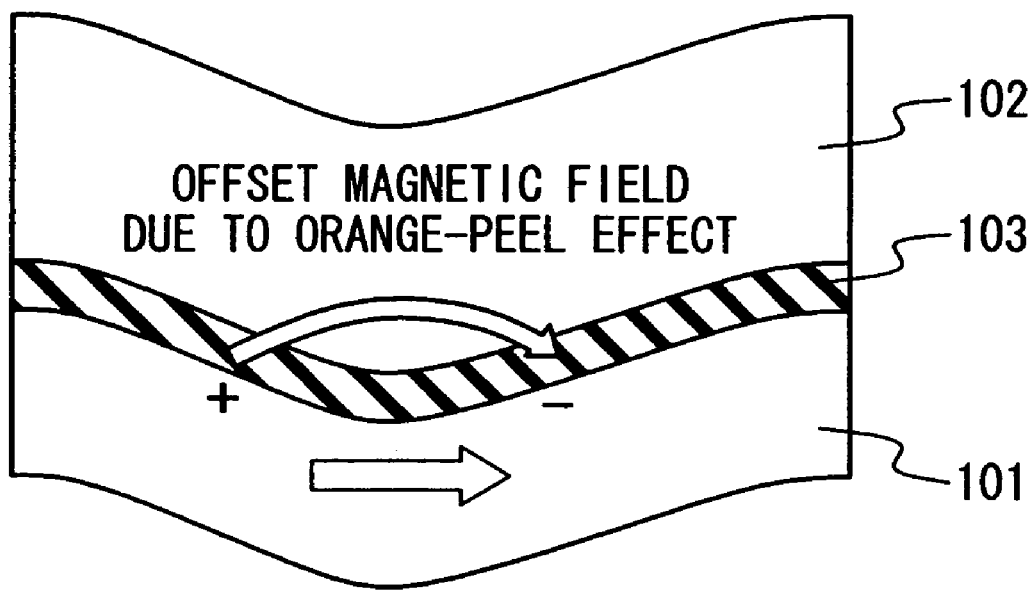
FIG. 3 is a diagram showing an offset magnetic field due to the orange peel coupling effect.
Figure 4:
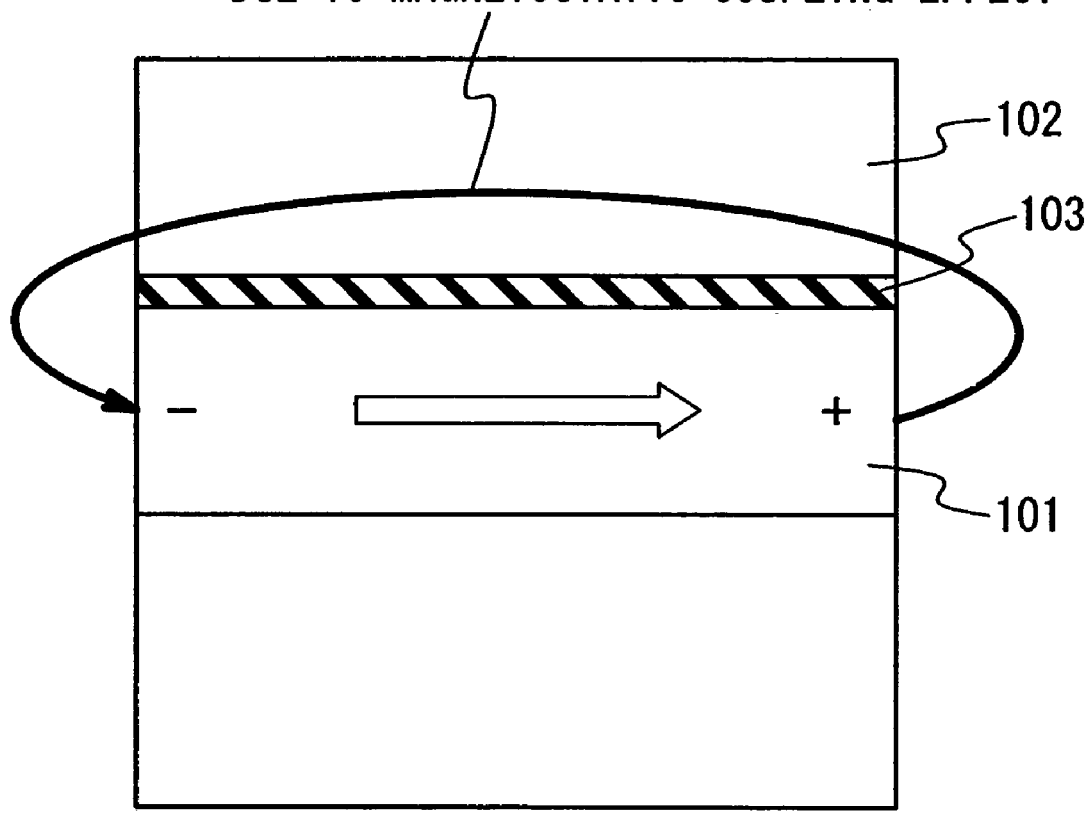
FIG. 4 is a diagram showing the offset magnetic field due to the magneto-static coupling effect.
Figure 5:
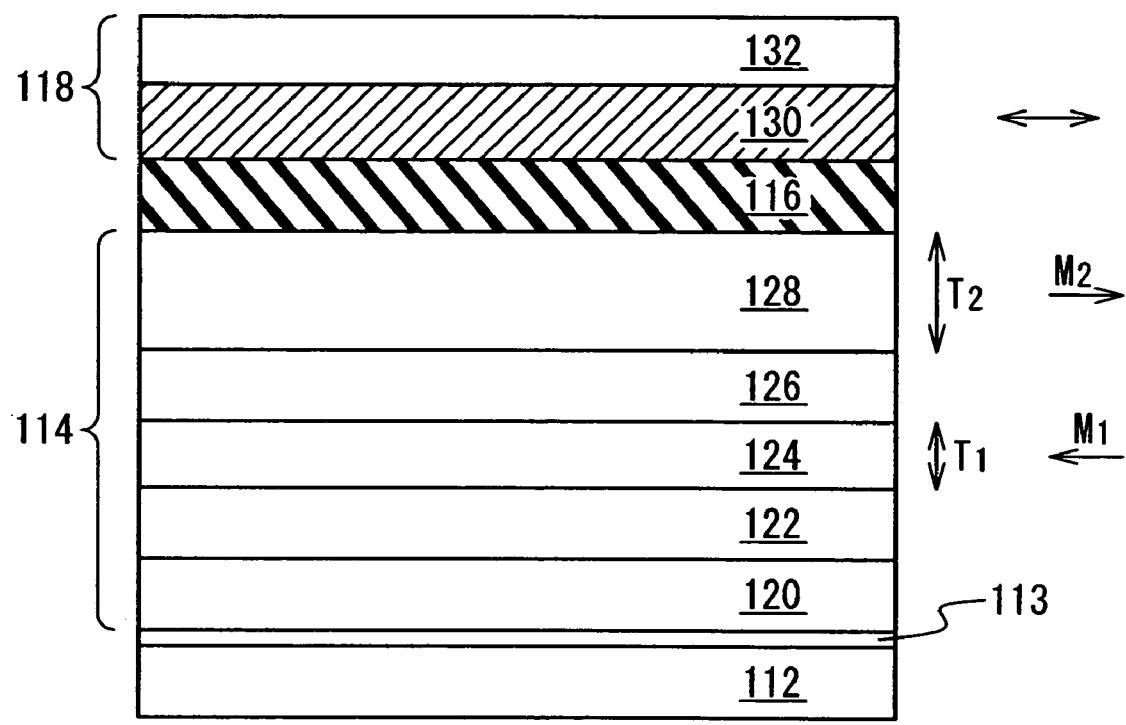
FIG. 5 is a cross sectional view showing a structure of a conventional MRAM.
Figure 6A:
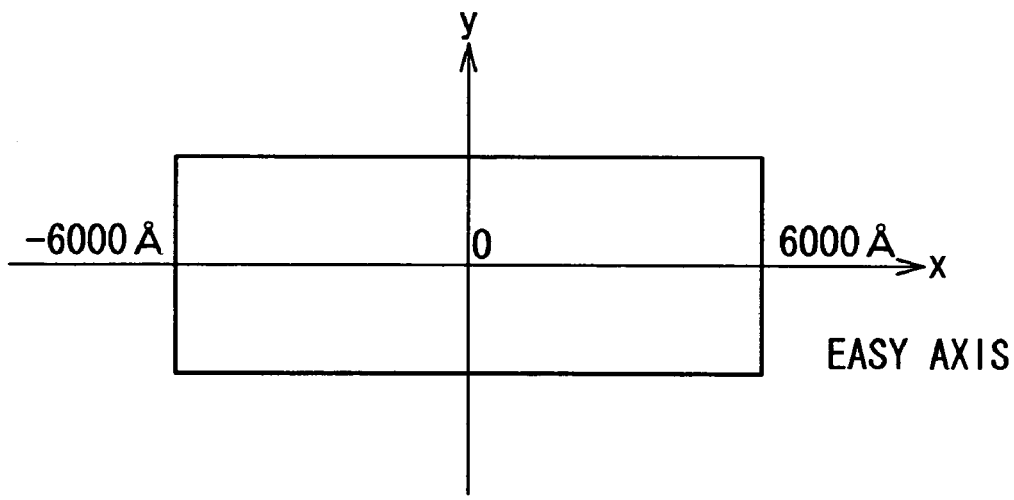
FIGS. 6A and 6B are diagrams showing ununiformity of the offset magnetic field due to the magneto-static coupling effect within the memory cell.
Figure 6B:
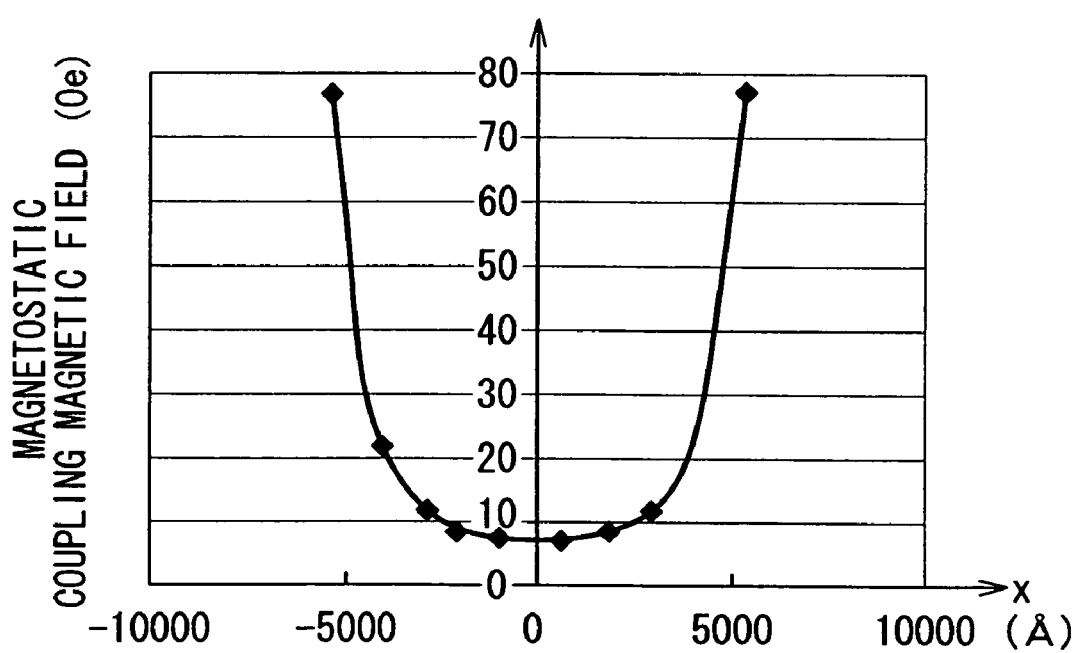

Hereinafter, an MRAM according to the present invention will be described with reference to the attached drawings.

[First Embodiment]

FIG. 7 indicates a structure of the MRAM according to a first embodiment of the present invention. It should be noted that for a better understanding of this structure, a ratio of the vertical length to the horizontal length in the structure of the MRAM shown in FIG. 7 is different from in a ratio in the structure of the actual MRAM.

The MRAM in the first embodiment is composed of a substrate 1 and a lower electrode 2. The substrate 1 has been formed on the substrate 1. The lower electrode 2 contains a metal lead layer 3, a seed layer 4, and an anti-ferromagnetic layer 5. The metal lead layer 3 is typically formed of Al or Cu. The seed layer 4 is typically formed from a Ta film or a synthetic film of a Ta film and a Ru film. The anti-ferromagnetic layer 5 is formed of anti-ferromagnetic material, and is typically formed of FeMn, IrMn, or PtMn.

A synthetic ferrimagnetic fixed layer 6 is formed on the lower electrode 2. The synthetic ferrimagnetic fixed layer 6 contains a first pinned layer 7, a second pinned layer 9, and a non-magnetic material spacer layer 8 interposed between these pinned layers 7 and 9. Each of the first pinned layer 7 and the second pinned layer 9 is formed of ferromagnetic material, and has a spontaneous magnetization. Each of the first pinned layer 7 and the second pinned layer 9 is typically formed of CoFe, NiFe, or NiFeCo. The non-magnetic material spacer layer 8 is formed of non-magnetic material having electric conductivity, and typically of Ru.

The first pinned layer 7 is formed on the anti-ferromagnetic layer 5, and the direction of the spontaneous magnetization of the first pinned layer 7 is fixed in a direction of "−x" through exchange coupling between the first pinned layer 7 and the anti-ferromagnetic layer 5. The seed layer 4 has a function to improve the exchange coupling characteristic between the anti-ferromagnetic layer 5 and the first pinned layer 7. In order to accomplish a better exchange coupling characteristic, it is preferable that the anti-ferromagnetic layer 5 and the first pinned layer 7 are formed, and then are subjected to heat treatment at a temperature that is equal to or higher than a blocking temperature at which the exchange coupling disappears, in a magnetic field equal to larger than several hundreds oersted. When the anti-ferromagnetic film 5e is formed of IrMn, it is preferable that the heat treatment is carried out for one hour at the temperature of 250 to 300° C.

The spontaneous magnetization of the second pinned layer 9 is fixed in a direction of "+x" through anti-ferromagnetic exchange coupling between the first pinned layer 7 and the second pinned layer 9. The direction of the spontaneous magnetization of the first pinned layer 7 is opposite to that of the spontaneous magnetization of the second pinned layer 9. In order to enhance the anti-ferromagnetic exchange coupling between the first pinned layer 7 and the second pinned layer 9, the film thickness of the non-magnetic spacer layer 8 is suppressed to be equal to or thinner than 10 angstroms.

In order to improve the characteristic of the synthetic ferrimagnetic fixed layer 6 with such a structure, after the synthetic ferrimagnetic fixed layer 6 is formed, it is desirable that heat treatment is carried out at the temperature in a range of 150 to 300° C. in a magnetic field equal to or larger than 10,000 oersteds.

An insulating barrier layer 10 is formed on the second pinned layer 9 of the synthetic ferrimagnetic fixed layer 6. The insulating barrier layer 10 is typically formed of aluminium oxide ($Al_2O_3$). The thickness of the insulating barrier layer 10 is made thin in such a manner that tunnel current can flow in a direction of the film thickness (namely, in a direction perpendicular to the substrate 1). Typically, the film thickness of the insulating barrier layer 10 is 1 to 5 nm.

Figure 8:
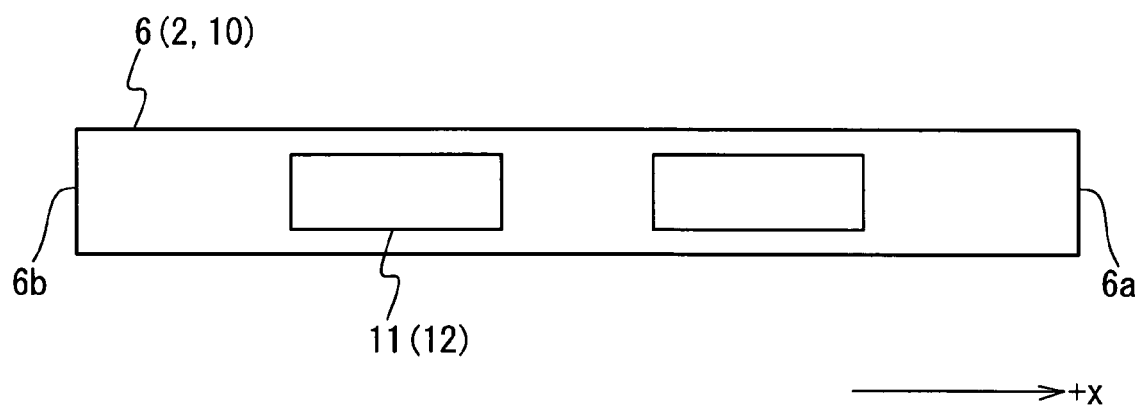
FIG. 8 is a plan view showing the MRAM according to the first embodiment of the present invention.

As shown in FIG. 8, the lower electrode 2, the synthetic ferrimagnetic fixed layer 6, and the insulating barrier layer 10 are provided to extend along an x-axis direction.

As shown in FIG. 7, a plurality of free layers 11 are formed on the insulating barrier layer 10. The free layer 11 is formed ferromagnetic material, and has a spontaneous magnetization. The spontaneous magnetization of the free layer 11 can be reversed. The free layer 11 is formed to extend along the x-axis direction and to be thin. The direction of the spontaneous magnetization of the free layer 11 is permitted to be directed along the "+x" direction and the "−x" direction. The free layer 11 is sufficiently separated from ends 6a and 6b of the synthetic ferrimagnetic fixed layer 6 such that a magnetic field generated by magnetic poles 6a and 6b which are produced at the ends of the synthetic ferrimagnetic fixed layer 6 does not substantially interlink with the magnetic field of the free layer 11.

One free layer 11, the insulating barrier layer 10, and the second pinned layer 9 of the synthetic ferrimagnetic fixed layer 6 constitute an MTJ (Magnetic Tunnel Junction). The MTJ is used as one memory cell. Data to be written in the memory cell is stored as the direction of the spontaneous magnetization of the free layer 11. The direction of the spontaneous magnetization of the free layer 11, namely data to be written in the memory cell gives an influence to the resistance of the MTJ (namely, the resistance of the memory cell). The data stored in the memory cell is discriminated by utilizing change in resistance of the MTJ.

An upper electrode 12 is formed on each of the plurality of free layers 11. The upper electrode 12 contains a cap layer 13 and a metal lead layer 14. The cap layer 13 is typically formed of Ta, and the metal lead layer 14 is typically formed of Al and Cu.

In accordance with the MRAM in this embodiment, the orange peel coupling effect and the magneto-static coupling effect are not canceled by each other, but both the orange peel coupling effect and the magneto-static coupling effect to the free layers 11 by the synthetic ferrimagnetic fixed layer 6 are positively decreased, and are reduced to substantially zero. As a result, the offset magnetic fields of the memory cells can be eliminated. Since the magnetic fields applied to the free layer 11 due to both the orange peel coupling effect and the magneto-static coupling effect are weak, or are equal to substantially zero, the problem of the offset magnetic field in the memory cell due to the deviations of the orange peel coupling effect and the magneto-static coupling effect can be effectively solved.

The fact that the orange peel coupling effect to the free layer 11 by the synthetic ferrimagnetic fixed layer 6 is reduced to substantially zero is accomplished by canceling the orange peel coupling effect to the free layer 11 by the second pinned layer 9 and the orange peel coupling effect to the free layer 11 by the first pinned layer 7. Both the first pinned layer 7 and the second pinned layer 8 give the free layer 11 the magnetic fields due to the orange peel coupling effect which is caused based on the non-flatness of the first pinned layer 7 and the second pinned layer 8. Since the directions of the spontaneous magnetizations of the first pinned layer 7 and the second pinned layer 9 are opposite to each other, the magnetic fields applied to the free layer 11 by the first pinned layer 7 and the second pinned layer 9 due to the orange peel coupling effect are opposite to each other. Therefore, since the magnitudes of the magnetic fields applied to the free layer 11 by the first pinned layer 7 and the second pinned layer 9 due to the orange peel coupling effect are made substantially equal to each other, the magnetic field applied to the free layer 11 by the synthetic ferrimagnetic fixed layer 6 due to the orange peel coupling effect can be reduced to substantially zero.

The cancellation of the orange peel coupling effect to the free layer 11 by the second pinned layer 9 and the first pinned layer 7 can be accomplished by optimizing a relationship among a magnetization "$M_1$" of the first pinned layer 7, a film thickness "$t_1$" of the first pinned layer 7, a magnetization "$M_2$" of the second pinned layer 9, and a film thickness "$t_2$" of the second pinned layer 9. The suitable relationship among the magnetizations $M_1$, $M_2$, and the film thickness $t_1$, $t_2$ is conducted below.

The orange peel coupling effect that one ferromagnetic film receives is larger when a distance between the one ferromagnetic film and another ferromagnetic film is shorter and when the magnetization of the other ferromagnetic film is stronger. As a consequence, the magnetization $M_1$ of the first pinned layer 7 which is separated from the free layer 11 further than the second pinned layer 9 is made larger than the magnetization $M_2$ of the second pinned layer 9, so that the magnitudes of the magnetic fields applied to the free layer 11 by both first pinned layer 7 and the second pinned layer 9 due to the orange peel coupling effect can be made equal to each other. Thus, the magnetic field applied to the free layer 11 by the synthetic ferrimagnetic fixed layer 6 due to the orange peel coupling effect can be reduced to essentially zero.

It is preferable to make the magnetization $M_1$ of the first pinned layer 7 larger than the magnetization $M_2$ of the second pinned layer 9 from the viewpoint of suppression of the orange peel coupling effect. However, it is not preferable from the viewpoint of simplification of a manufacturing process of the MRAM. In order to simplify the manufacturing process of the MRAM, it is preferable to form both the first pinned layer 7 and the second pinned layer 9 of the same material. In this case, the magnetization $M_1$ of the first pinned layer 7 is made substantially equal to the magnetization $M_2$ of the second pinned layer 9.

However, even when the magnetization $M_1$ of the first pinned layer 7 is made substantially equal to the magnetization $M_2$ of the second pinned layer 9, the orange peel coupling effect by the synthetic ferrimagnetic fixed layer 6 can be suppressed and can be reduced to essentially zero by optimizing both the film thickness $t_1$ of the first pinned layer 7 and the film thickness $t_2$ of the second pinned layer 9. The theoretical consideration of this fact will be made as follows:

In the above conventional report, J. C. S. Kools et al. calculates an offset magnetic field "$H_{off}$" by the orange peel coupling effect in case that two ferromagnetic films are waved in a periodical manner. According to a model by Kools et al., this offset magnetic field "$H_{off}$" is approximately calculated by the following equation (1):

$$H_{off} = \frac{2\pi^2 h^2 M_P}{\sqrt{2}\lambda t_F} \cdot \exp\left(-2\pi\frac{\sqrt{2}\, t_{AlO}}{\lambda}\right) \cdot \left[1-\exp\left(-2\pi\frac{\sqrt{2}\, t_P}{\lambda}\right)\right] \cdot \left[1-\exp\left(-2\pi\frac{\sqrt{2}\, t_F}{\lambda}\right)\right], \quad (1)$$

In this equation (1), "h" is an amplitude of wave of the ferromagnetic film; "$\lambda$" is a period of the wave of the ferromagnetic film; "$t_F$" is a film thickness of a ferromagnetic film which is influenced by the orange peel coupling effect; "$M_P$" is a magnetization of the ferromagnetic film which applies the orange peel coupling effect, and "$t_{AlO}$" is a film thickness of a non-magnetic film which is interposed between the ferromagnetic films. If the model by Kools et al. is extended to apply this model to the synthetic ferrimagnetic fixed layer 6, a magnitude "$H_{OFF}$" of an offset magnetic field that the free layer 11 receives from the synthetic ferrimagnetic fixed layer 6 due to the orange peel coupling effect is expressed by the following equation (2):

$$H_{off} = \frac{2\pi^2 h^2 M_P}{\sqrt{2}\lambda t_F} \cdot \left[\exp\left(-2\pi\frac{\sqrt{2}\, t_{AlO}}{\lambda}\right) \cdot \left\{1-\exp\left(-2\pi\frac{\sqrt{2}\, t_2}{\lambda}\right)\right\} \cdot \left\{1-\exp\left(-2\pi\frac{\sqrt{2}\, t_F}{\lambda}\right)\right\} - \exp\left\{-2\pi\frac{\sqrt{2}\,(t_{AlO}+t_2+t_R)}{\lambda}\right\} \cdot \left\{1-\exp\left(-2\pi\frac{\sqrt{2}\, t_1}{\lambda}\right)\right\} \cdot \left\{1-\exp\left(-2\pi\frac{\sqrt{2}\, t_F}{\lambda}\right)\right\}\right], \quad (2)$$

In this equation (2), "h" is magnitudes of the waves of the first pinned layer 7, the second pinned layer 9, and the free layer 11; "$\lambda$" is a period of the waves; "$t_R$" is a film thickness of the non-magnetic spacer layer 8; "$t_F$" is a film thickness of the free layer 11; "$t_{AlO}$" is a film thickness of the insulating barrier layer 10; "$t_1$" is a film thickness of the first pinned layer 7; "$t_2$" is a film thickness of the second pinned layer 9; and "$M_P$" is magnitudes of magnetizations of both the first pinned layer 7 and the second pinned layer 9. This magnitude "$M_P$" is equal to "$M_1$" and "$M_2$".

Figure 9:
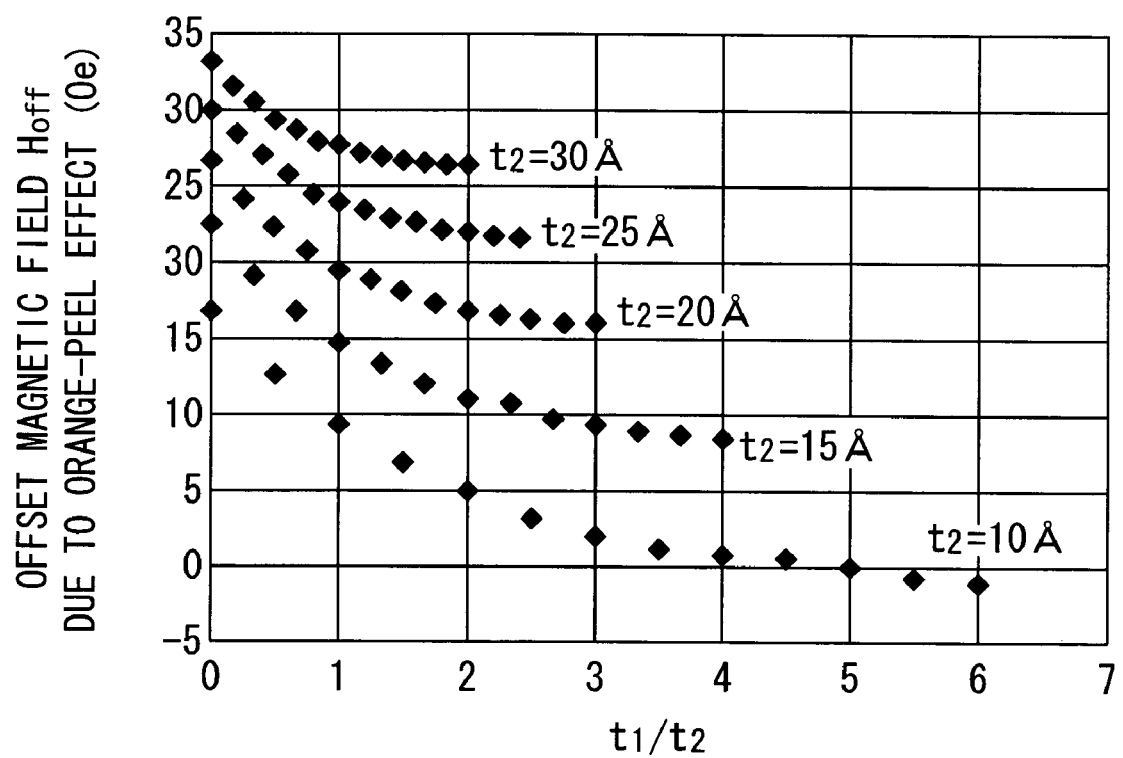
FIG. 9 is a graph showing the offset magnetic field due to the orange peel coupling effect.

FIG. 9 is a graph showing a relationship between $t_1/t_2$ and the magnitude $H_{OFF}$ of the offset magnetic field, by using the thickness "$t_2$" of the second pinned layer 9 as a parameter. It should be understood that in this graph, "h" is 7 angstroms, "$\lambda$" is 180 angstroms, and "$t_{AlO}$" is 15 angstroms. As shown in FIG. 9, when "$t_2$" is equal to or shorter than 10 angstroms and "$t_1/t_2$" is about 4.5, the magnitude "$H_{OFF}$" of the offset magnetic field to the free layer 11 by the synthetic ferrimagnetic fixed layer 6 due to the orange peel coupling effect can be reduced to substantially zero. Also, under other conditions, the magnitude $H_{OFF}$ of the offset magnetic field due to the orange peel coupling effect can be reduced to substantially zero by optimizing both the film thickness $t_1$ of the first pinned layer 7 and the film thickness $t_2$ of the second pinned layer 9.

It should be understood that there is a case that it is not suitable due to another factor in the design of the MRAM that the orange peel coupling effect to the free layer 11 by the synthetic ferrimagnetic fixed layer 6 is reduced to substantially zero. Even in such a case, it is desirable that the magnetic field applied to the free layer 11 by the synthetic ferrimagnetic fixed layer 6 due to the orange peel coupling effect is positively decreased. It is preferable that the magnetic field applied to the free layer 11 by the staked-layer ferrimagnetic fixed layer 6 due to the orange peel coupling effect is suppressed to be equal to lower than 10 (Oe). Such a condition can be achieved by optimizing the relationship among the magnetization $M_1$ of the first pinned layer 7, the magnetization $M_2$ of the second pinned layer 9, the film thickness $t_1$ of the first pinned layer 7, and the film thickness $t_2$ of the second pinned layer 9.

More specifically, the magnetic field applied to the free layer 11 by the synthetic ferrimagnetic fixed layer 6 due to the orange peel coupling effect can be reduced by increasing $M_1/M_2$. As already described, the direction of the spontaneous magnetization of the first pinned layer 7 is to the direction of the spontaneous magnetization of the second pinned layer 9, and the distance from the free layer 11 to the first pinned layer 7 is larger than the distance from the free layer 11 to the second pinned layer 9. The magnitude of the magnetic field applied to the free layer 11 due to the orange peel coupling effect is smaller, when the distance between the ferromagnetic film and the free layer 11 becomes larger. For this reason, the magnetic field applied to the free layer 11 by the synthetic ferrimagnetic fixed layer 6 due to the orange peel coupling effect can be reduced by making the magnetization $M_1$ larger than the magnetization $M_2$, namely, by increasing $M_1/M_2$.

Figure 10:
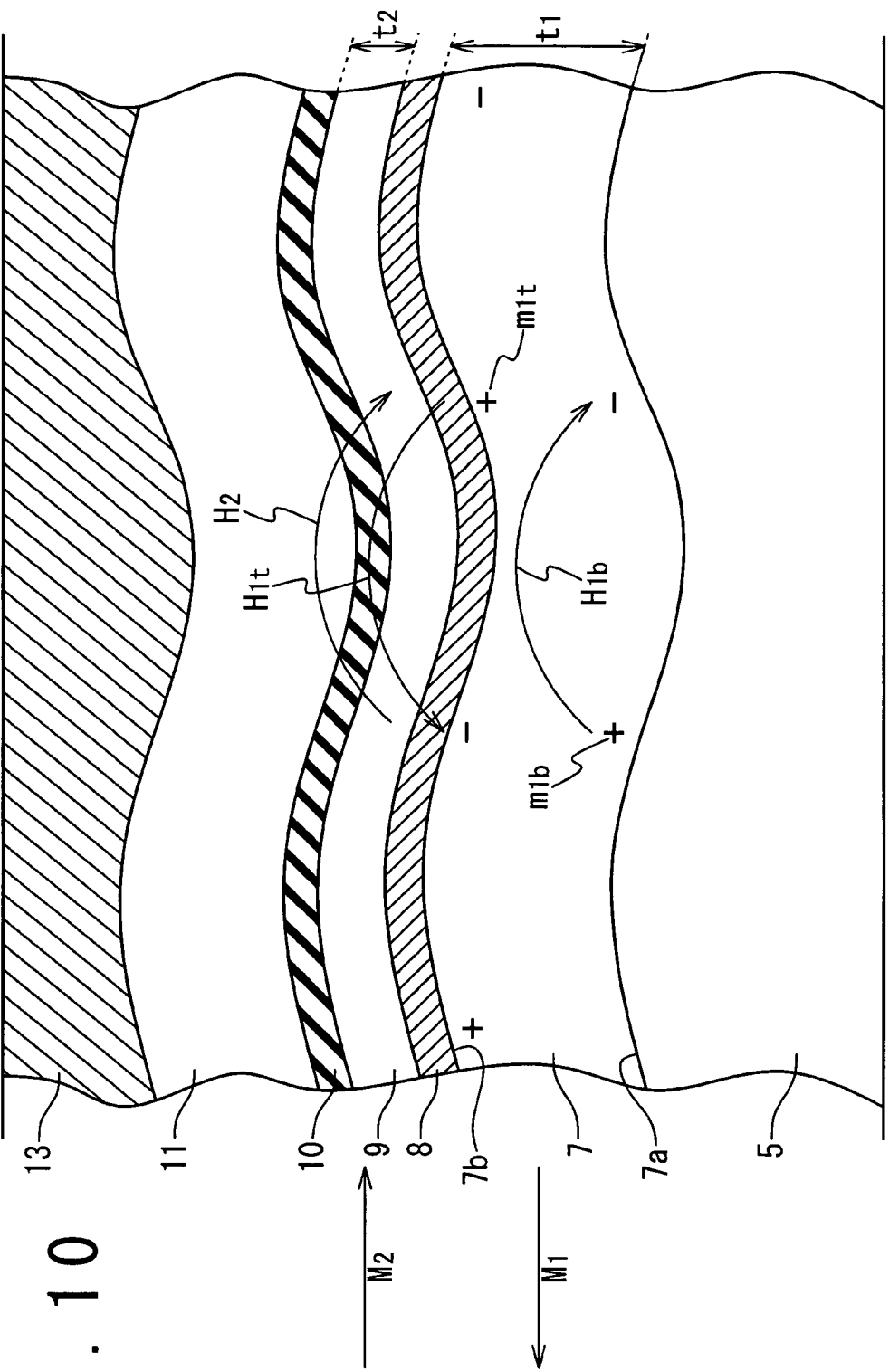
FIG. 10 is a diagram showing the orange peel coupling effect by a first pinned layer 7 to a free layer 11.

Also, the magnetic field applied to the free layer 11 by the synthetic ferrimagnetic fixed layer 6 due to the orange peel coupling effect can be reduced by increasing $t_1/t_2$. FIG. 10 is a diagram for explaining this reason. That is, when the film thickness $t_2$ of the second pinned layer 9 is thinner, the magnitudes of the magnetic fields applied by both the first pinned layer 7 and the second pinned layer 9 due to the orange peel coupling effect are approximately near values. As previously explained, the directions of the magnetic fields applied to the free layer 11 by the first pinned layer 7 and the second pinned layer 9 due to the orange peel coupling effect are opposite to each other. As a consequence, when the film thickness $t_2$ of the second pinned layer 9 is thinner, the magnetic field applied to the free layer 11 by the synthetic ferrimagnetic fixed layer 6 due to the orange peel coupling effect is decreased.

On the other hand, the film thickness $t_1$ of the first pinned layer 7 is thicker, the canceling effect is increased that the magnetic field applied to the free layer 11 by the second pinned layer 9 due to the orange peel coupling effect is canceled by the magnetic field applied to the free layer 11 by the first pinned layer 7 due to the orange peel coupling effect. The reason is as follows. That is, the magnetic field "$H_2$" applied to the free layer 11 by the second pinned layer 9 due to the orange peel coupling effect is a synthetic magnetic field of a magnetic field generated by magnetic poles which are produced on an interface plane between the second pinned layer 9 and the non-magnetic spacer layer 8 and a magnetic field generated by magnetic poles which are produced on an interface plane between the second pinned layer 9 and the insulating barrier layer 10. Since the latter magnetic field is stronger than that of the former magnetic field, the direction of the synthesized magnetic field $H_2$ is coincident with the direction of the spontaneous magnetization of the second pinned layer 9.

On the other hand, the magnetic field applied to the free layer 11 by the first pinned layer 7 due to the orange peel coupling effect is generated by:

(1) magnetic poles "$m_{1b}$" which is produced on an interface plane 7a between the first pinned layer 7 and the antiferromagnetic layer 5, and (2) magnetic poles "$m_{1t}$" which is produced on an interface plane 7b between the first pinned layer 7 and the non-magnetic spacer layer 8. A magnetic field "$H_{1t}$" generated by the magnetic poles "$m_{1t}$" cancels the magnetic field "$H_2$" applied to the free layer 11 by the second pinned layer 9 due to the orange peel coupling effect. Also, the direction of a magnetic field "$H_{1b}$" generated by the magnetic poles "$m_{1b}$" is the same as that of the magnetic field $H_2$, and has a function to increase the offset magnetic field of the free layer 11. For this reasons, it is desirable that the magnetic field $H_{1b}$ generated by the magnetic poles "$m_{1b}$" is not applied to the free layer 11. When the film thickness $t_1$ of the first pinned layer 7 is thicker, the magnetic field $H_{1b}$ applied to the free layer 11 by the magnetic poles $m_{1b}$ is smaller. As a consequence, the magnetic poles $m_{1t}$ operate to strongly cancel the magnetic field applied to the free layer 11 by the second pinned layer 9 due to the orange peel coupling effect. Accordingly, the canceling effect becomes larger that the magnetic field applied to the free layer 11 by the second pinned layer 9 due to the orange peel coupling effect is canceled by the magnetic field applied to the free layer 11 by the first pinned layer 7 due to the orange peel coupling effect, when the film thickness $t_1$ of the first pinned layer 7 is increased.

In this way, when the film thickness $t_1$ of the first pinned layer 7 is thicker and the film thickness $t_2$ of the second pinned layer 9 is thinner, namely, when the ratio of $t_1/t_2$ is increased, the magnetic field applied to the free layer 11 by the synthetic ferrimagnetic fixed layer 6 due to the orange peel coupling effect is small.

When the ratio of $M_1/M_2$ and the ratio of $t_1/t_2$ are larger, the magnetic field applied to the free layer 11 by the synthetic ferrimagnetic fixed layer 6 due to the orange peel coupling effect can be reduced. In this case, it is suitable that both the ratio of $M_1/M_2$ and the ratio of $t_1/t_2$ are increased to an extent that the following equation (3) can be satisfied:

$$\frac{M_1}{M_2} \cdot \frac{t_1}{t_2} > 1 \qquad (3)$$

When both the ratio of $M_1/M_2$ and the ratio of $t_1/t_2$ are increased to the extent that the above-mentioned equation (3) can be satisfied, the magnetic field applied to the free layer 11 by the synthetic ferrimagnetic fixed layer 6 due to the orange peel coupling effect can be effectively reduced.

At this time, as described above, in order to simplify the manufacturing process of the MRAM, it is desirable to form both the first pinned layer 7 and the second pinned layer 9 of the same material. In this case, the magnetization $M_1$ of the first pinned layer 7 is made substantially coincident with the magnetization $M_2$ of the second pinned layer 9. In such a case, it is possible that the equation (3) can be satisfied, by making the film thickness $t_1$ of the first pinned layer 7 thicker than the film thickness $t_2$ of the second pinned layer 9, namely, by satisfying $t_1 > t_2$.

On the other hand, as shown in FIG. 8, the suppression of the magnetic field applied to the free layer 11 by the synthetic ferrimagnetic fixed layer 6 due to the magneto-static coupling effect can be achieved by sufficiently extending the synthetic ferrimagnetic fixed layer 6 in the x-axis direction in such a manner that the free layer 11 is sufficiently largely separated from the ends 6a and 6b of the synthetic ferrimagnetic fixed layer 6. The free layer 11 is separated from the ends 6a and 6b of the synthetic ferrimagnetic fixed layer 6 to an extent that the magnetic field generated by the magnetic poles produced at the ends 6a and 6b of the synthetic ferrimagnetic fixed layer 6 does not substantially interlink with a magnetic field applied to the free layer 11. Since the magneto-static coupling effect is induced by the magnetic poles produced on the ends 6a and 6b, the magneto-static coupling effect which is influenced to the free layer 11 by the synthetic ferrimagnetic fixed layer 6 can be reduced to substantially zero by sufficiently largely separating the ends 6a and 6b of the synthetic ferrimagnetic fixed layer 6 from the free layer 11.

It should be noted that for another factor in the design of the MRAM, there is a case that it is not preferable to the magneto-static coupling effect which is influenced to the free layer 11 by the synthetic ferrimagnetic fixed layer 6 is reduced to substantially zero. Even in this case, it is preferable that the magnetic field applied to the free layer 11 by the synthetic ferrimagnetic fixed layer 6 due to the magneto-static coupling effect is positively decreased, and more preferably to 10 (Oe) or below. It possibly comes in practice by sufficiently largely separating the ends 6a and 6b of the synthetic ferrimagnetic fixed layer 6 from the free layer 11 that the magnetic field applied to the free layer 11 by the synthetic ferrimagnetic fixed layer 6 due to the magneto-static coupling effect is decreased 10 (Oe) or below.

As described above, in the MRAM according to this embodiment, the magnetic field applied to the free layer 11 by the synthetic ferrimagnetic fixed layer 6 due to the orange peel coupling effect can be reduced to substantially zero, or is decreased to 10 (Oe) or below, by optimizing both the magnetization $M_1$ and the film thickness $t_1$ of the first pinned layer 7, and both the magnetization $M_2$ and the film thickness $t_2$ of the second pinned layer 9, which are contained in the synthetic ferrimagnetic fixed layer 6. Further, the magnetic field applied to the free layer 11 by the synthetic ferrimagnetic fixed layer 6 due to the magneto-static coupling effect is reduced to substantially zero, or is decreased 10 (Oe) or below, by sufficiently largely separating the ends 6a and 6b of the synthetic ferrimagnetic fixed layer 6 from the free layer 11. Through adoption of the above structures, the offset magnetic field applied to the memory cell can be effectively reduced. Since the magnetic field applied to the free layer 11 by the synthetic ferrimagnetic fixed layer 6 due to the orange peel coupling effect and the magneto-static coupling effect is reduced, the adverse influence of the manufacturing fluctuation is small, and furthermore, the ununiformity over the memory cells is also suppressed.

[Second Embodiment]

Figure 11:
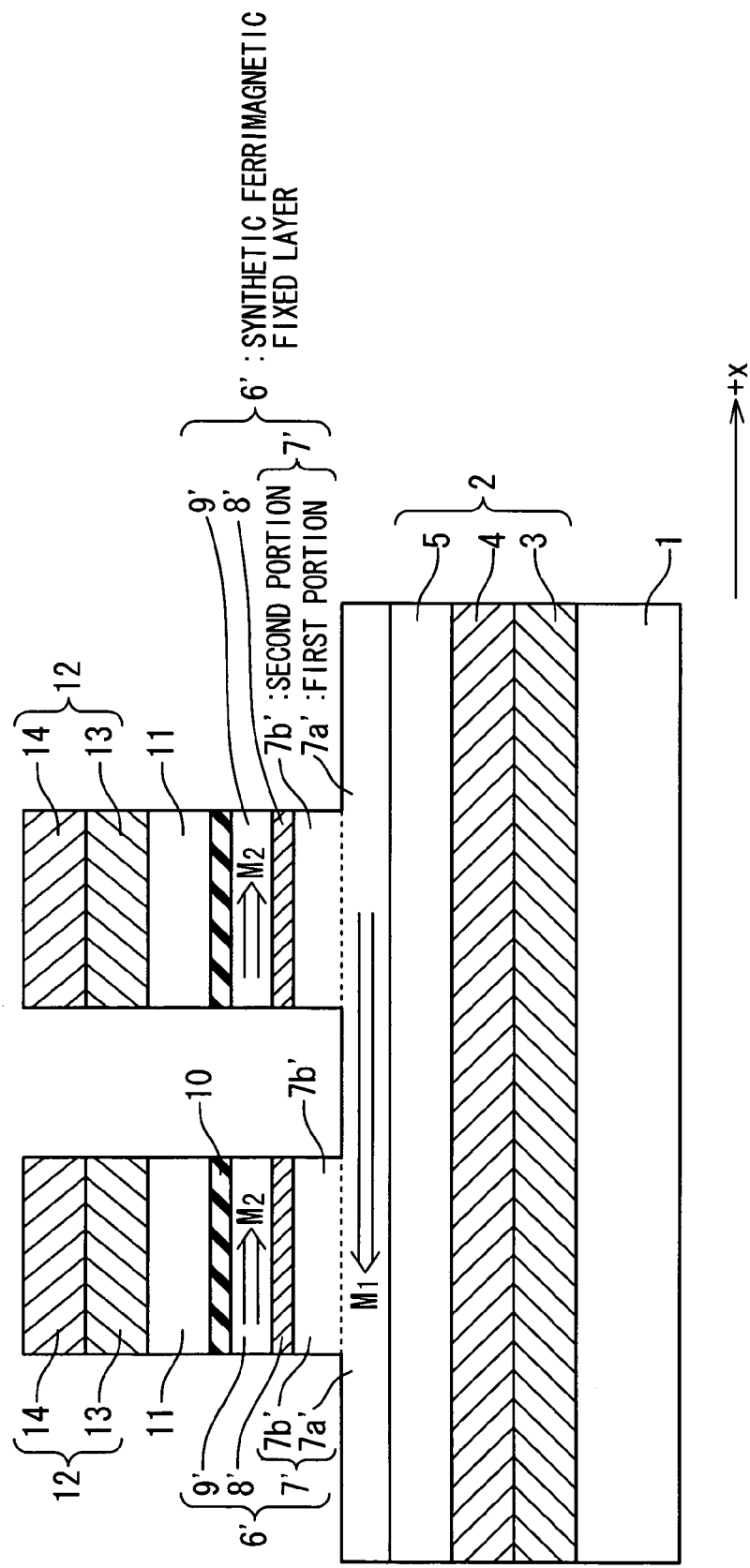
FIG. 11 is a cross sectional view showing the MRAM according to a second embodiment of the present invention.

FIG. 11 shows the structure of an MRAM according to the second embodiment of the present invention. It should be noted that a ratio of the horizontal length and the vertical length in the structure of the MRAM shown in FIG. 11 is different from a ratio of them in the structure of the actual MRAM, for a better understanding of this structure.

In the MRAM of the second embodiment, both the orange peel coupling effect and the magneto-static coupling effect are suppressed by a synthetic ferrimagnetic fixed layer 6' having a structure which is different from that of the synthetic ferrimagnetic fixed layer 6 in the first embodiment.

The synthetic ferrimagnetic fixed layer 6' in the MRAM of the second embodiment contains a first pinned layer 7', a plurality of non-magnetic spacer layers 8', and second pinned layers 9' formed on the non-magnetic spacer layers 8'. Both the first pinned layer 7' and the second pinned layer 9' are formed of ferromagnetic material, and therefore have spontaneous magnetizations. The first pinned layer 7' and the second pinned layer 9' are typically formed of CoFe, NiFe, or NiFeCo. The non-magnetic spacer layer 8' is formed of non-magnetic material having electric conductivity, typically, of Ru.

The first pinned layer 7' is formed on the anti-ferromagnetic layer 5, and the direction of the spontaneous magnetization of the first pinned layer 7' is fixed in a "−x" direction through exchange coupling between the first pinned layer 7 and the anti-ferromagnetic layer 5. The direction of the spontaneous magnetization of the second pinned layer 9' is fixed in a "+x" direction through anti-ferromagnetic exchange coupling between the first pinned layer 7' and the second pinned layer 9'. Thus, the direction of the spontaneous magnetization of the first pinned layer 7 is opposite to that of the spontaneous magnetization of the second pinned layer 9.

The first pinned layer 7' is composed of a first portion 7a' formed on the anti-ferromagnetic layer 5 and a second portion "7b'. The first portion 7a' is provided to extend in the x-axis direction. Ends of the first portion 7a' are formed to be sufficiently separated from the free layer 11.

The plurality of the second portions 7b' are provided on the first portion 7a'. Each second portion 7b' is provided for one of the second pinned layers 9'. The non-magnetic spacer layer 8' is formed on the second portion 7b', and the second pinned layer 9' is formed on the non-magnetic spacer layer 8'. An insulating barrier layer 10, a free layer 11, and an upper electrode 12 are sequentially formed on the second pinned layer 9'.

The second portion 7b', the non-magnetic spacer layer 8', the second pinned layer 9', the insulating barrier layer 10, the free layer 11, and the upper electrode 12 are formed through an etching process in a self-alignment. As a result, as viewed from a direction perpendicular to the surface of the substrate 1, the second pinned layer 9' and the second portion 7b' have the same shapes, and also are aligned with each other in position.

Also, in the second embodiment, similar to the MRAM of the first embodiment, both the orange peel coupling effect and the magneto-static coupling effect to the free layer 11' by the synthetic ferrimagnetic fixed layer 6' are positively decreased, and are reduced to substantially zero. As a result, the offset magnetic fields in the memory cells can be suppressed and eliminated.

Similar to the first embodiment, suppression of the orange peel coupling effect to the free layer 11 by the synthetic ferrimagnetic fixed layer 6' can be accomplished by optimizing both the film thickness $t_1$ and magnetization $M_1$ of the first pinned layer 7', and both the film thickness $t_2$ and magnetization $M_2$ of the second pinned layer 9'. In this case, the film thickness $t_1$ of the first pinned layer 7' in this second embodiment is equal to a summation of the film thickness $t_{1b}$ of the first portion 7a' and the film thickness $t_{1t}$ of the second portion 7b'. The magnetic field applied to the free layer 11 by the synthetic ferrimagnetic fixed layer 6' due to the orange peel coupling effect is positively reduced, is more preferably decreased to 10 (Oe) or below, and is most suitably suppressed to essentially zero.

As described above, it is possible that the magnetic field applied to the free layer 11 by the synthetic ferrimagnetic fixed layer 6' due to the orange peel coupling effect can be reduced to essentially zero, by setting to $M_1 > M_2$, or by optimizing the film thicknesses $t_1$ and $t_2$ even when $M_1 = M_2$.

Moreover, when the magnetic field applied to the free layer 11 by the synthetic ferrimagnetic fixed layer 6' due to the orange peel coupling effect cannot be reduced to substantially zero, both the film thickness $t_1$ and magnetization $M_1$ of the first pinned layer 7', and both the film thickness $t_2$ and magnetization $M_2$ of the second pinned layer 9' are determined so as to satisfy the above-described equation (3). As a consequence, the magnetic field applied to the free layer 11 by the synthetic ferrimagnetic fixed layer 6' due to the orange peel coupling effect can be suppressed. When the same materials are used for both the first pinned layer 7' and the second pinned layer 9' from the viewpoint of simplification of the manufacturing process so that both the magnetizations $M_1$ and $M_2$ are made substantially equal to each other, both the film thickness $t_1$ of the first pinned layer 7' and the film thickness $t_2$ of the second pinned layer 9' are determined to satisfy $t_1 > t_2$.

Figure 12:
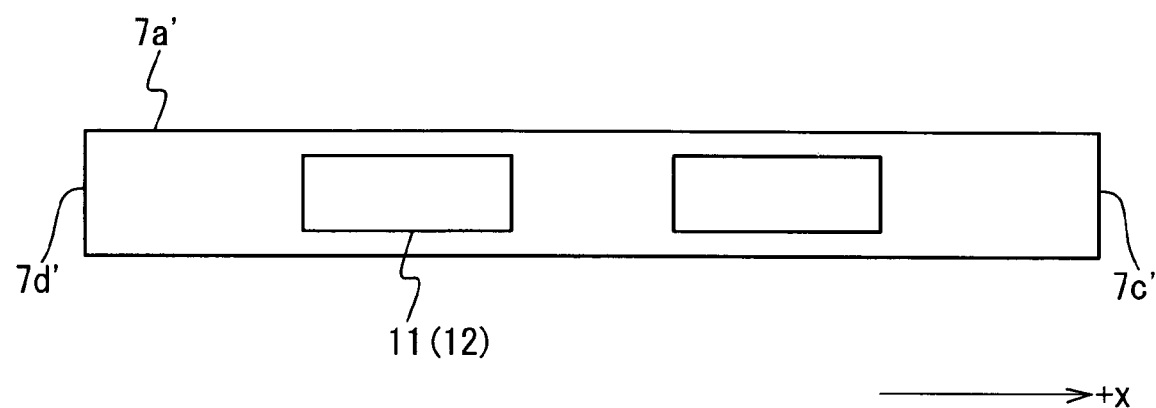
FIG. 12 is a plan view showing the MRAM according to the second embodiment of the present invention.

On the other hand, suppression of the magneto-static coupling effect is accomplished through optimization of the structure of the first portion 7a' and the second portion 7b' in the first pinned layer 7'. As shown in FIG. 12, the first portion 7a' extends along the x-axis direction such that the ends 7c' and 7d' of the first portion 7a' are sufficiently separated from the free layer 11. More specifically, both the ends 7c' and 7d' of the first portion 7a' are sufficiently separated from the free layer 11 such that that the magnetic field generated by the magnetic poles produced in the ends 7c' and 7d' does not substantially interlink with a magnetic field by the free layer 11.

As shown in FIG. 13, the second portion 7b' is formed in such a manner that the magneto-static coupling effect to the free layer 11 by the second pinned layer 9' is canceled with the magneto-static coupling effect to the free layer 11 by the second portion 7b'. More specifically, the film thickness $t_{1t}$ of the second portion 7b' is formed in such a manner that the film thickness $t_{1t}$ is made substantially coincident with $(M_2/M_1)*t_2$. As described above, the determination of the film thickness $t_{1t}$ of the second portion 7b' is canceled with the magneto-static coupling effect to the free layer 11 by the second pinned layer 9'. As a result, the magnetic field applied to the free layer 11 by the synthetic ferrimagnetic fixed layer 6' due to the magneto-static coupling effect can be reduced to substantially zero. The magnitude of a magnetic field "$H_{1tc}$" generated by the magnetic poles produced in ends 7e' and 7f' of the second portion 7b' is proportional to $M_1*t_{1t}$. On the other hand, the magnitude of a magnetic field "$H_{2c}$" generated by the magnetic poles produced in ends 9a' and 9b' of the second pinned layer 9' is proportional to $M_2*t_2$. As described above, since the direction of the magnetization $M_1$ is opposite to that of the magnetization $M_2$, the direction of the magnetic field $H_{1tc}$ is also opposite to that of the magnetic field $H_{2c}$. As a consequence, the magneto-static coupling effect to the free layer 11 by the second pinned layer 9' can be canceled with the magneto-static coupling effect to the free layer 11 by the second portion 7b' by making the magnitude of the magnetic field $H_{1tc}$ substantially coincident with that of the magnetic field $H_{2c}$ so that the film thickness $t_1$ of the second portion $7b'$ is made substantially coincident with $(M_2/M_1)*t_2$.

As described above, the magnetic field applied to the free layer 11 by the synthetic ferrimagnetic fixed layer 6' due to the magneto-static coupling effect can be reduced to substantially zero by optimizing the structure of the first portion $7a'$ and the second portion $7b'$. Even when the magnetic field applied to the free layer 11 by the synthetic ferrimagnetic fixed layer 6' due to the magneto-static coupling effect is not reduced to substantially zero, the magnetic field applied to the free layer 11 by the synthetic ferrimagnetic fixed layer 6' due to the magneto-static coupling effect can be easily decreased to be equal to or smaller than 10 (Oe), by determining the film thickness $t_{1'}$ of the second portion $7b'$ to be a value in the vicinity of $(M_2/M_1)*t_2$.

As described above, in the MRAM of the second embodiment, the magnetic field applied to the free layer 11 by the synthetic ferrimagnetic fixed layer 6' due to the orange peel coupling effect can be reduced to substantially zero, or can be decreased to be equal to or smaller than 10 (Oe) by optimizing both the film thickness $t_1$ and the magnetization $M_1$ of the first pinned layer 7' and both the film thickness $t_2$ and the magnetization $M_2$ of the second pinned layer 9', which are contained in the synthetic ferrimagnetic fixed layer 6'. Moreover, the magnetic field applied to the free layer 11 by the synthetic ferrimagnetic fixed layer 6' due to the magneto-static coupling effect can be reduced to substantially zero, or can be decreased equal to or smaller than 10 (Oe) by optimizing the structure of the first portion $7a'$ of the first pinned layer 7' and the second portion $7b'$ thereof. Through employment of the structure, the offset magnetic field of the memory cell can be effectively decreased. Since the magnetic field applied to the free layer 11 by the synthetic ferrimagnetic fixed layer 6 due to the orange peel coupling effect and the magneto-static coupling effect are reduced, the adverse influence caused by the manufacturing deviation becomes small, and further, the ununiformity within the memory cell can be also suppressed.

The invention claimed is:

1. A magnetic random access memory comprising a plurality of memory cells, each of which comprises:
   a free layer which has a reversible free spontaneous magnetization;
   a synthetic ferrimagnetic fixed layer; and
   a spacer layer formed of non-magnetic material and interposed between said free layer and said synthetic ferrimagnetic fixed layer,
   wherein said synthetic ferrimagnetic fixed layer comprises:
   a first pinned layer which has a first fixed spontaneous magnetization fixed in a first direction; and
   a second pinned layer which has a second fixed spontaneous magnetization fixed in a second direction which is opposite to said first direction,
   said first pinned layer comprises:
   a first portion provided to extend said first direction; and
   a second portion formed on said first portion such that said second portion is aligned in position with said second pinned layer in a direction perpendicular to a surface of a substrate on which said magnetic random access memory is formed,
   said first pinned layer and said second pinned layer are formed such that said synthetic ferrimagnetic fixed layer does not substantially influence on said free layer due to orange peel effect,
   when said first fixed spontaneous magnetization is $M_1$ said second fixed spontaneous magnetization is $M_2$ and said second pinned layer has a thickness of $t_2$, said second portion is formed to have a thickness of $(M_2/M_1)*t_2$, and
   said synthetic ferrimagnetic fixed layer is formed such that said synthetic ferrimagnetic fixed layer does not substantially give influence of the magneto-static coupling effect to said free layer.

2. A magnetic random access memory comprising a plurality of memory cells, each of which comprises:
   a free layer which has reversible free spontaneous magnetization;
   a synthetic ferrimagnetic fixed layer; and
   a spacer layer of non-magnetic material interposed between said free layer and said synthetic ferrimagnetic fixed layer,
   wherein said synthetic ferrimagnetic fixed layer comprises:
   a first pinned layer which has first fixed spontaneous magnetization in said first direction; and
   a second pinned layer provided between said free layer and said first pinned layer to have second fixed spontaneous magnetization in said second direction which is opposite to said first direction,
   said first pinned layer comprises:
   a first portion provided to extend in said first direction and said second direction; and
   a second portion formed on said first portion such that said second portion is aligned in position with said second pinned layer in a direction perpendicular to a surface of a substrate on which said magnetic random access memory is formed, and
   when said first fixed spontaneous magnetization is $M_1$, said second fixed spontaneous magnetization is $M_2$ and a thickness of said second pinned layer is $t_2$, said second portion has a thickness substantially equal to $(M_2/M_1)*t_2$.

3. A magnetic random access memory comprising a plurality of memory cells, each of which comprises:
   a free layer which has reversible free spontaneous magnetization;
   a synthetic ferrimagnetic fixed layer; and
   a spacer layer of non-magnetic material interposed between said free layer and said synthetic ferrimagnetic fixed layer,
   wherein said synthetic ferrimagnetic fixed layer comprises:
   a first pinned layer which has first fixed spontaneous magnetization in a first direction; and
   a second pinned layer provided between said spacer layer and said first pinned layer to have a second fixed spontaneous magnetization fixed in a second direction which is opposite to said first direction, and
   said first fixed spontaneous magnetization $M_1$, said second fixed spontaneous magnetization $M_2$, a film thickness $t_1$ of said first pinned layer and a film thickness $t_2$ of said second pinned layer are determined to satisfy the following equation:

$$\frac{M_1}{M_2} \cdot \frac{t_1}{t_2} > 1$$

4. The magnetic random access memory according to claim 3, wherein said $M_1$ and said $M_2$ are substantively equal to each other.

5. The magnetic random access memory according to claim 3, wherein said first pinned layer and said second pinned layer are formed of same material.

6. The magnetic random access memory according to claim 3, wherein the following equation:

$$M_1 > M_2$$

is satisfied.

* * * * *